United States Patent [19]
Saito

[11] Patent Number: 5,979,541
[45] Date of Patent: Nov. 9, 1999

[54] COOLING FAN AND COOLING FAN ASSEMBLY

[75] Inventor: Kohichi Saito, Suwa, Japan

[73] Assignee: Seiko Epson Corporation, Tokyo, Japan

[21] Appl. No.: 08/875,342

[22] PCT Filed: Nov. 20, 1996

[86] PCT No.: PCT/JP96/03393

§ 371 Date: Aug. 6, 1997

§ 102(e) Date: Aug. 6, 1997

[30] Foreign Application Priority Data

Nov. 20, 1995 [JP] Japan ................................ 7-301717

[51] Int. Cl.$^6$ ............................................ H05K 7/20
[52] U.S. Cl. .................... 165/80.3; 165/122; 361/697;
415/178; 415/211.1; 415/223; 417/423.7;
417/423.14; 417/354
[58] Field of Search .................................... 165/121, 122,
165/80.3, 185; 174/16.3; 257/722; 361/695,
697; 415/176, 177, 178, 211.1, 213.1, 223;
417/423.7, 423.14, 353, 354

[56] References Cited

U.S. PATENT DOCUMENTS

| | | | |
|---|---|---|---|
| 4,307,314 | 12/1981 | Yamada et al. | 310/263 |
| 4,371,313 | 2/1983 | Burgbacher et al. | 415/213.1 X |
| 4,617,485 | 10/1986 | Nakamura et al. | 310/65 |
| 4,713,567 | 12/1987 | Fey et al. | 310/105 |
| 5,019,880 | 5/1991 | Higgins, III | 165/80.3 X |
| 5,177,391 | 1/1993 | Kusase | 310/263 |
| 5,504,650 | 4/1996 | Katsui et al. | 361/697 |
| 5,526,875 | 6/1996 | Lin | 165/80.3 |
| 5,559,674 | 9/1996 | Katsui | 361/697 |
| 5,597,034 | 1/1997 | Barker, III et al. | 165/80.3 |
| 5,629,560 | 5/1997 | Katsui et al. | 257/722 X |

FOREIGN PATENT DOCUMENTS

| 17014 | 2/1979 | Japan . |
|---|---|---|
| 98358 | 8/1981 | Japan . |
| 11874 | 2/1995 | Japan . |

*Primary Examiner*—Leonard Leo
*Attorney, Agent, or Firm*—Oliff & Berridge, PLC

[57] ABSTRACT

With the objective of providing a cooling fan and a cooling fan assembly in which the cooling efficiency is high, and which has been lightened, the invention has been composed by a cooling fan 1, a casing 2 composed from a casing main body 3 and a lid part 4 in which a circular aperture 42 is formed, a fan motor 5 arranged within this casing 2, a circuit board 8 and the like. A plurality of radiator plates 32 are arranged in a standing formation in the outer peripheral part 312 of the casing main body 3. The fan motor 5 includes a rotor 7 in which seven fan blades 72 are arranged as projecting toward the outer peripheral direction, and a stator 6 fixed in a base plate 31. The outermost diameter b of the large diameter part 722 of the fan blades 72 is set so that it is larger than the inner periphery of the aperture 42, and the outer diameter c of the inner diameter part 723 of the fan blades 72 is set as smaller than the inner diameter of the aperture 42. Due to this composition, in accordance with a cooling fan and cooling fan assembly of the present invention, the cooling effect is improved, because it is possible to improve the force of the air current without thickening the thickness of the cooling fan, in conjunction with it being possible to prevent the extraction of the rotor from the aperture.

15 Claims, 8 Drawing Sheets

COOLING FAN AND COOLING FAN ASSEMBLY

BACKGROUND OF THE INVENTION

1. Field of the Invention

This invention relates to a cooling fan and a cooling fan assembly which are used for cooling an object.

2. Description of Related Art

Cooling fans are widely utilized to cool the air surrounding electrical circuits in electronic apparatuses. For example, cooling fans are used in personal computers to cool the CPU and other electrical/electronic components.

This type of cooling fan has a casing that includes a casing main body with a side radiator and a lid with an aperture formed therein. A fan motor includes a rotor provided with a plurality of fan blades and a stator and is disposed in the casing. Also, an object to be cooled is joined to a base surface of the casing main body and the aperture and radiator form a circulating air flow conduit when the fan motor is driven. As a result, heat generated from the object to be cooled is dispersed and the object is cooled.

Conventional cooling fans exist in which the fan motor is arranged on the side of the lid. However, there are problems with this cooling fan in that the force of the air current is small and therefore the cooling effect is low. Also, conventional cooling fans are noisy and they typically have a casing main body that is thick.

Further, in another conventional cooling fan, the fan motor is arranged on the casing main body and a distal end of a rotational axle of the rotor is installed in the casing main body by perforating the base plate of the casing main body and using a ball bearing or washer. In this type of cooling fan, the cooling effect is diminished because the force of the air current is small and, thus, the cooling effect is low. This type of cooling fan is noisy and its casing main body is thick. Moreover, it has holes for installing the rotational axle of the rotor on the outer side base surface of the casing main body. Because the rotor is installed in the casing main body, an assembly process is required to turn the cooling fan over which reduces productivity of manufacturing.

OBJECTS OF THE INVENTION

Therefore, the objects of the present invention are to provide a cooling fan assembly in which the cooling effect is high, the assembly is easy and its casing body is thinner than convention cooling fans.

SUMMARY OF THE INVENTION

The objects are achieved by implementing a cooling fan and a cooling fan assembly of the present invention.

The cooling fan includes a casing having a casing main body with a side radiator and a lid with an aperture formed therein, and a fan motor having a rotor with a plurality of fan blades that project radially outward and a stator. By driving the fan motor, an air current is produced that flows through the aperture and the side radiator to cool the object to be cooled. An outer diameter of the fan blades is larger than an inner diameter of the aperture and the fan blades rotate without contacting the lid.

Each of the fan blades has a large diameter part and a small diameter part. The outer diameter of the large diameter part is larger than the inner diameter of the aperture. The outer diameter of the small diameter part is smaller than the inner diameter of the aperture. At least a portion of the small diameter part is positioned within the aperture.

Each of the fan blades has a cutaway portion and an edge defining the aperture is positioned within the cutaway portion. The fan motor is driven to aspirate air from the aperture and expel the air from the radiator. The stator is mounted to a base within the casing main body and the rotor is indirectly supported within the casing main body. The rotor is magnetically attracted to the base at least when the rotation of the rotor is stopped. An outer side base surface of said casing main body contacts the object to be cooled and the outer side base surface without apertures.

The radiator has a plurality of radiator plates arranged in an upright position and in the axial direction of rotation of the rotor. An air current path formed between said radiator plates has a cross-sectional area toward an air expulsion direction that is gradually increased. At least one of the radiator plates acts as a position-determining part that determines the position of the circuit board within the casing main body.

A circuit board on the base within the casing main body, controls the actuation of the fan motor. A center portion of the circuit board is displaced with respect to a rotational center of the fan motor.

A top surface of the rotor either is in agreement with a top surface of the lid, or is positioned in a vicinity of a bottom side of the lid. The rotor includes a rotation axle having a distal end contacting the base of the casing main body at a point.

The stator has a coil and a pair of yokes. Each yoke includes a plurality of claws disposed about an outer periphery of the coil.

A cooling fan assembly comprises the cooling fan described above along with the object to be cooled connected to the cooling fan.

The present invention has the following particular advantages.

With the cooling fan and cooling fan assembly of the present invention, the amount of the force of the air current is improved without enlarging the thickness of the cooling fan and extraction of the rotor from the aperture is prevented. Improved cooling efficiency also results.

Further, cooling efficiency of the present invention is high because the surface of the cooling fan contacting the object to be cooled is a smooth surface without apertures. Some conventional cooling fans have contact surfaces with apertures formed therein.

Further, noise is low because the air current paths formed between the respective radiator plates have gradually increasing cross-sectional areas toward the air expulsion direction. By comparison, some conventional cooling fans have cross-sectional areas with air current paths that are constant.

Further, assembly is easy because it is possible to assemble the cooling fan from one direction since the rotor is not directly supported by the casing main body and because an assembly process step of turning the cooling fan over is unnecessary.

Further, the number of components to produce the present invention is reduced because at least one of the radiator plates has a dual use as a position-determining part that determines the position of the circuit board. Thus, it is possible to reduce costs.

DETAILED DESCRIPTION OF THE PREFERRED EMBODIMENTS

The cooling fan and cooling fan assembly of the present invention are described below in detail based on the preferred embodiments shown in the attached figures.

Figure 1:
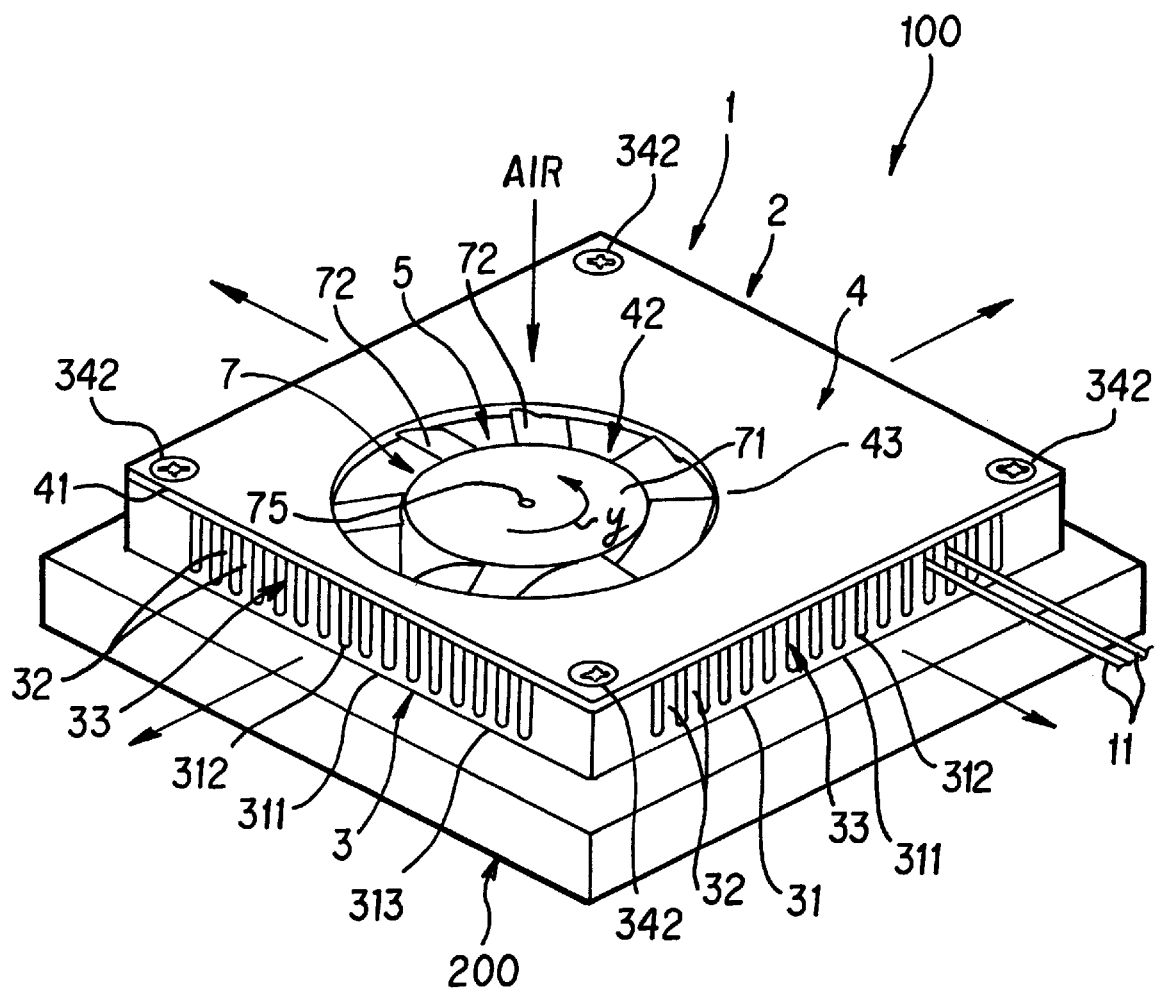
FIG. 1 is a perspective view showing a cooling fan of the present invention.
Figure 2:
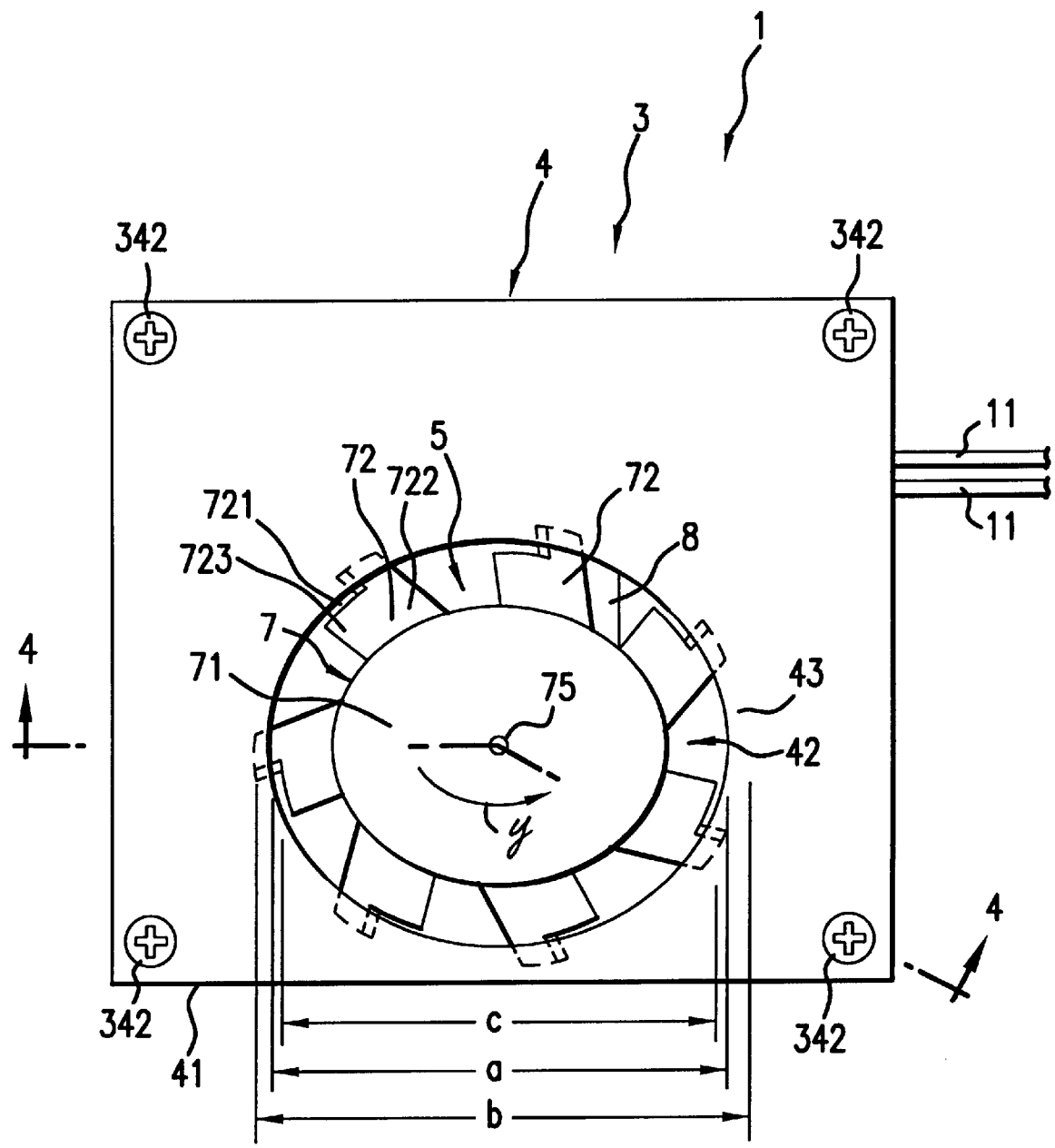
FIG. 2 is a planar view of the cooling fan shown in FIG. 1.
Figure 3:
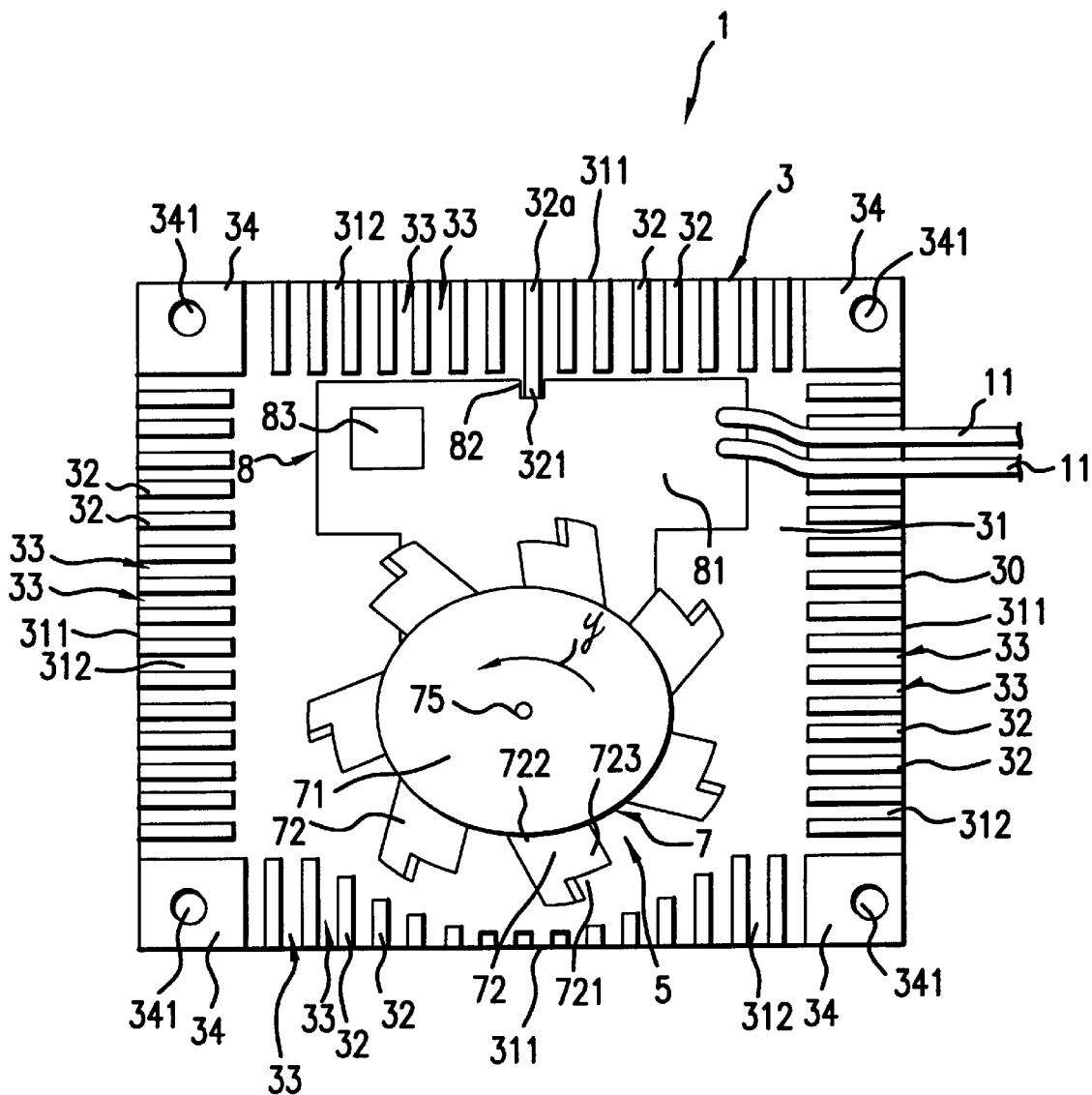
FIG. 3 is a planar view showing the structure in which a lid of the cooling fan shown in FIG. 1 has been removed.
Figure 4:
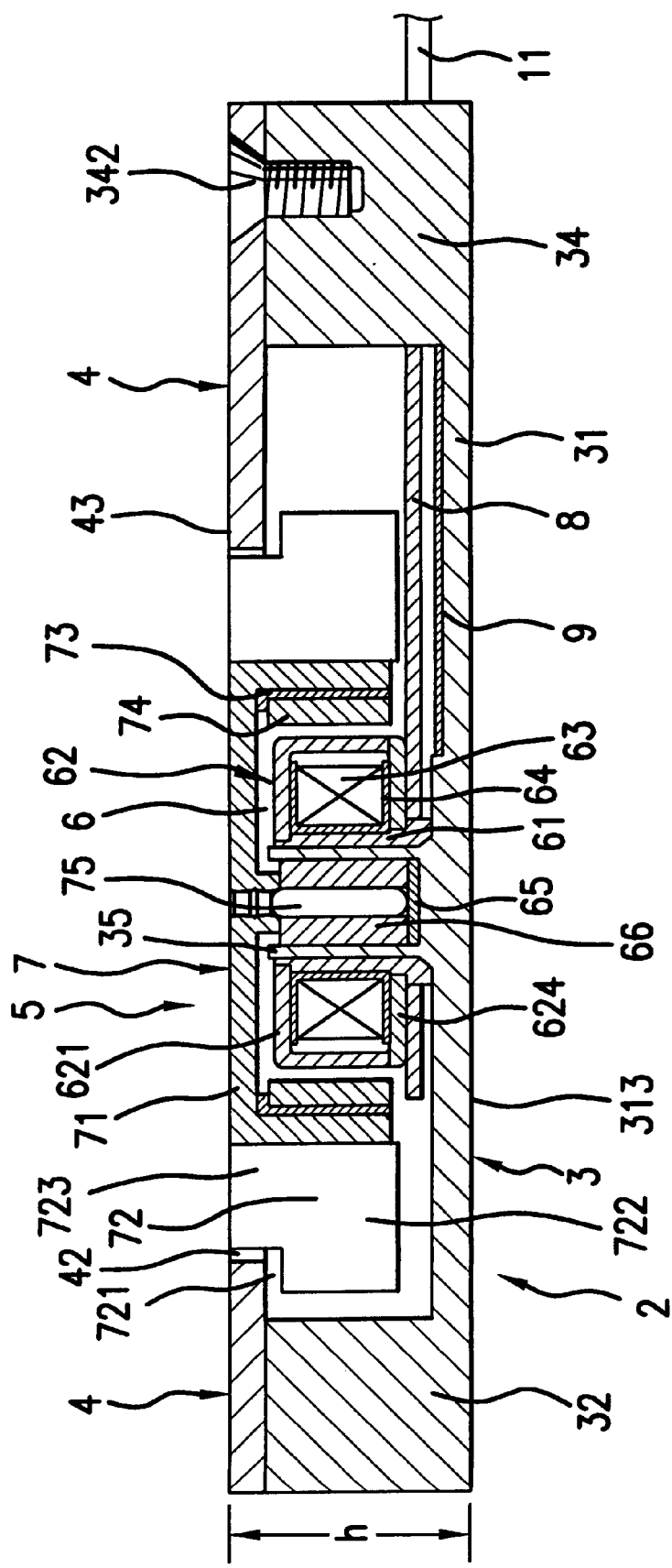
FIG. 4 is a cross-sectional view of the cooling fan of the present invention taken along line 4—4 in FIG. 2.

FIG. 1 is a perspective view showing a cooling fan 1 and a cooling fan assembly 100 of the present invention. FIG. 2 is a planar view of the cooling fan 1 shown in FIG. 1 and FIG. 3 is a planar view showing a state in which a lid 4 of the cooling fan 1 shown in FIG. 1 is removed. FIG. 4 is a cross-sectional view taken along line 4—4 in FIG. 2.

As shown in these figures, the cooling fan assembly 100 is includes the cooling fan 1, and an object 200 to be cooled 200 which is connected to a base plate 31 of the cooling fan 1.

A CPU (central computer processing unit), a microprocessor, a semiconductor element such as a RISC processor, an electronic circuit and the like are examples of the objects 200 to be cooled. Specifically, it is possible to use the cooling fan 1 for cooling the CPU of a notebook-type personal computer.

There is no particular limitation in the manner in which the object 200 to be cooled can be installed onto an outer side base surface 313 of the cooling fan 1. For example, an adhesive agent such as glue, a sticky adhesive such as tape or the like can be used.

The cooling fan 1 of cooling fan assembly 100 comprises a casing 2 and a fan motor 5 disposed within casing 2. The casing 2 includes a casing main body 3 and the lid 4. The fan motor 5 includes stator 6 and a rotor 7 in which a plurality of fan blades 72 are provided.

The casing main body 3 of the casing 2 includes the base plate 31 which is substantially orthogonal in shape and a radiator portion 30 formed on an outer peripheral portion 312 of the base plate 31.

The radiator portion 30 includes a plurality of radiator plates 32. That is, the plurality of radiator plates 32 are disposed around the outer peripheral portion 312 of the base plate 31 as shown in FIG. 1, and are arranged in an upright manner in an axial direction of rotation of the rotor 7 so that they are positioned vertically with respect to corresponding sides 311. In this case, each radiator plate 32 is arranged at equal intervals along the corresponding sides 311.

Further, one radiator plate 32a is located in the center of the side 311 at an upper portion of the base plate 31 shown in FIG. 3 and has a length that is longer in a vertical direction than the other radiator plates 32, so that its distal end 321 projects into an interior of the base plate 31 more than distal ends of the other radiator plates 32 that are on the same upper side. The distal end 321 of the radiator plate 32a mates with a notch 82 of a circuit board 8, which will be described later, thus regulating the position of the circuit board 8 within the base plate 31. In this way, it is possible to determine the position of the circuit board 8 within the base plate 31 without increasing the number of components. Thus, the radiator plate 32a serves a dual function as a position-determining component that regulates the position of the circuit board 8. Therefore, it is possible to reduce costs.

Further, each of the radiator plates 32 in the side 311 at a bottom portion of the base plate 31 as shown in FIG. 3 has lengths that are respectively set in the vertical direction so that the location of these distal ends form an arc that is substantially equal to or slightly larger than the location of a distal end of a large diameter part 722 of the fan blade 72 which is the outermost peripheral part of the rotor 7. As a result, the position of the fan motor 1, which will be described later, is at the bottom portion of the base plate 31 as shown in FIG. 3. This portion of the fan motor 1 prevents the casing 2 from becoming enlarged.

Figure 5:
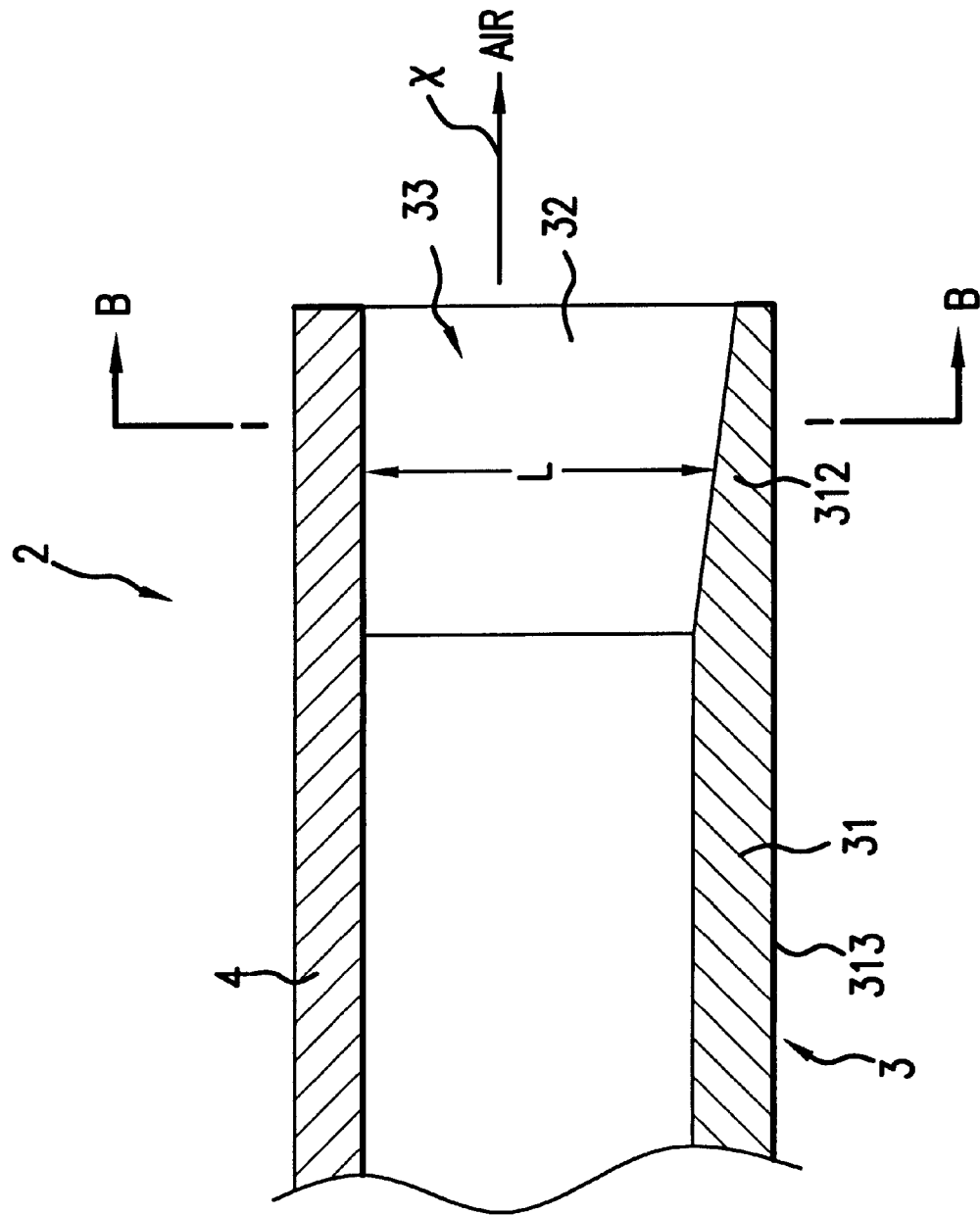
FIG. 5 is a cross-sectional view showing a side portion of a casing of the cooling fan shown in FIG. 1.

FIG. 5 is horizontal cross-sectional view showing a side portion of the casing 2. As shown in the same figure, the outer peripheral part 312 of the base plate 31 of the casing main body 3 has a tapered shape.

As a result, a length "L" of the base plate 31 in the side portion of the casing 2, is gradually increased toward the outside (the right side in FIG. 5) from the inside (the left side in FIG. 5). That is, the horizontal cross-sectional area (the area in the cross section viewed from line B—B in FIG. 5) of each of air current paths 33 formed between two adjacent radiator plates 32 is gradually increased toward the outside (a direction in which the air is expelled as shown by arrow "x") from the inside.

Consequently, noise is decreased because each air current path 33 flows smoothly toward the outside from the inside and air is expelled to the outside of the cooling fan 1.

Moreover, it is also possible have a structure so that the cross-sectional area is gradually increased toward the outside (the direction in which the air is expelled as shown by arrow "x") from the inside, only in selected ones of the air current paths 33 formed between the two adjacent radiator plates 32. This also allows noise to be reduced.

Shown in FIG. 4, the outer side base surface 313 of the base plate 31 has a surface that contacts the object 200 to be cooled and acts as a heat absorption surface that absorbs heat generated from the object 200 to be cooled. The outer side base surface 313 has a smooth surface with no pierced holes, uneven apertures, or the like. Therefore, the cooling efficiency is high as compared to a conventional cooling fan in which apertures are provided in heat absorption surface contacting the object to be cooled.

Further, a hollow cylindrical protrusion 35 of a cylindrical shape, to which the stator 6 of the fan motor 5 is mounted within the parentheses (which will be described later), is formed on the base plate 31. The center of this protrusion 35 is positioned at a prescribed distance from a center of the base plate 31 to the bottom portion of the base plate 31 shown in FIG. 3.

Support posts 34 are provided respectively in each of the four corners of the base plate 31 and a setscrew 342 and an installation screw hole 341 are matably engaged at selected portions of each support post 34.

The shape of the lid 4 of the casing 2 has a substantially orthogonal plate configuration, to the base plate 31 of the casing main body 3. A substantially circular air aspiration aperture 42 is formed in the lid 4.

As shown in FIG. 2, a center of the aperture 42 is displaced to a bottom side 51 from a lid center of the lid 4 so the center of the aperture 42 is nearly in agreement with a center of rotation of the fan motor 5, which will be described later.

Holes are provided (not shown) for the insertion of the setscrews 342, respectively, in the four corners of lid 4. The lid 4 is fixed via the setscrews 342 to the casing main body 3 to integrally form the casing 2.

Aluminum, aluminum alloy, copper, copper alloy, magnesium, magnesium alloy, titanium, stainless steel, other metal materials such as various types of steel materials, and the like, are examples of materials used to fabricate the casing main body 3 and the lid 4.

It is preferable if the casing main body 3 is integrally formed by the kind of metal materials described above.

Moreover, it is preferable to apply a covering layer over the outer side base surface 313 of the casing 2 by (electro) plating, vacuum deposition, spattering and the like to improve corrosion resistance, heat efficiency and the like. Further, other components could also be applied with such covering layer.

As shown in FIG. 4, the stator 6 of the fan motor 5 has a holder 61 and a yoke 62 supported by the holder 61. The holder 61, which has a nearly cylindrical shape, is mounted about an outer peripheral side of the protrusion 35 of the casing main body 3, which has been previously described. Therefore, the stator 6, that is, the fan motor 5, is arranged so that its center of rotation is in a position displaced to the bottom portion from the center of the base plate 31 of the casing main body 3 as shown in FIG. 3.

Figure 6:
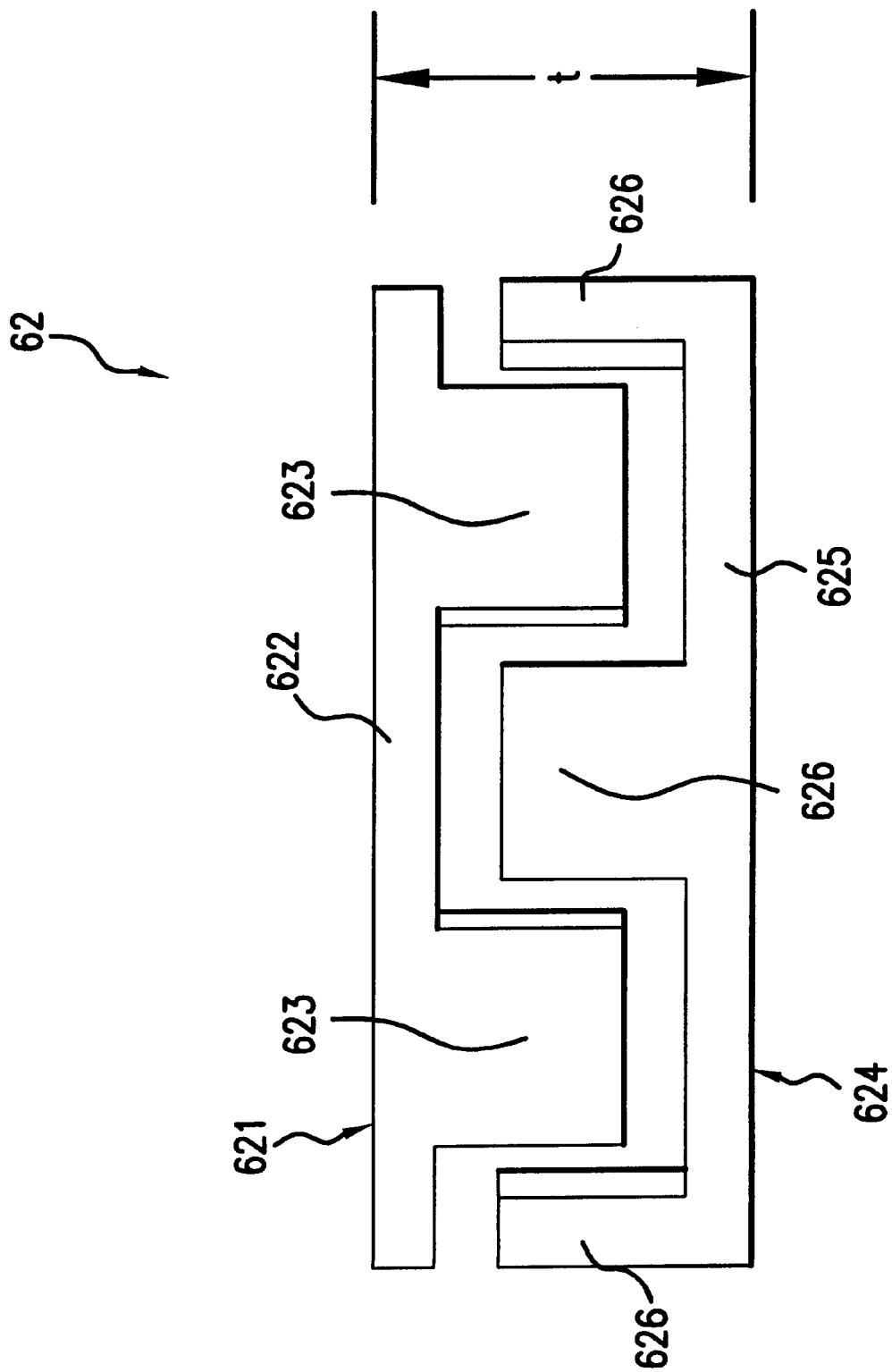
FIG. 6 is a side view showing a yoke of a fan motor of the cooling fan of the present invention shown in FIG. 1.

FIG. 6 is a side view showing the yoke 62 of the fan motor 5. As shown in this figure, the yoke 62 is composed of a first yoke 621 and a second yoke 624.

The first yoke 621 has a disk-shaped first base part 622 and four first claw parts 623 provided in the outer periphery of the first base part 622 and arranged at equal intervals therearound. Similarly, the second yoke 624 has a disk-shaped second base part 625 and four second claw parts 626 provided in the outer periphery of the second base part 625, are arranged at equal intervals therearound, and engaged with the four first claw parts 623. Also, the first yoke 621 and the second yoke 624 are arranged so as to engage without having the first claw parts 623 and the second claw parts 626, which extend in opposite directions, come into contact.

By this kind of structure, it is possible to narrow the thickness "t" of the yoke. As a result, it is possible to make a thickness "h" (FIG. 4) of the cooling fan 1 thinner and lighter.

In FIG. 4, bobbin 64, having a coil 63 that is wound therearound, is supported in an interior of the yoke 62, i.e., in the outer periphery side of the holder 61.

As a result, the claw parts 623 and 626 are respectively set at prescribed intervals in the outer periphery of the coil 63. Also, because the claw parts 623 and 626 are juxtaposed, four juxtaposed terminals are formed as N poles and S poles in the yoke 62, via electric conduction to the coil 63.

Further, a rotation axle 75 of the rotor 7, which will be described later, is set in the inner periphery of the protrusion 35 of the casing main body 3 with a washer 65 and an axle receiver 66, which support the rotation axle 65 so that it can rotate freely.

The rotor 7 of the fan motor 5 has a rotor main body 71. A magnet case 73 that accommodates a cylindrical permanent magnet 74 is set in the inner periphery of the rotor main body 71. The cylindrical permanent magnet 74 is magnetically attached to a plurality of terminals to correspond to the yoke 62. That is, four terminals are each magnetically attached in a juxtaposed relationship at the N pole and the S pole toward the direction of the inner periphery of the rotor main body 71.

The positional relationships with respect to the center of the yoke 62 of the stator 6 and the center of the cylindrical permanent magnet 74 of the rotor 7 are set so that the center of the cylindrical permanent magnet 74 of the rotor 7 is displaced to a top side in FIG. 4, i.e., the magnetic center is displaced. As a result, at least when the fan motor 5 is idle, the rotor 7 is magnetically attracted toward the base plate 31 and the distal end of its rotation axle 75 is positioned in the vertical direction, shown in FIG. 4, abutting the washer 65 of the stator 6. Therefore, even when vibration or shaking is applied, for example, to the cooling fan 1, the fan blades 72 do not contact or project onto an edge defining the air aspiration aperture 42.

The rotation axle 75 is connected to the center of the rotor main body 71. A distal end part of the rotation axle 75 has a substantially semi-cylindrical shape so that the distal end part contacts the washer 65 disposed in the casing main body 3 at a point.

The rotation axle 75 is inserted into the axle receiver 66 of the stator 6 and, as described above, the position of its distal end is positioned in the vertical direction, as shown in FIG. 4, abutting the washer 65. Because the distal end of the rotor 75 contacts the washer 65 at a point, when driving the fan motor 5, friction is decreased, and, as a result, it is possible to prevent a reduction in torque.

Moreover, in the cooling fan 1, the rotation axle 75 does not penetrate the base plate 31. That is, the rotor 7 is not directly supported by the casing main body 3 but rather the rotation axle 75 is installed into the casing main body 3 from the opposite side as shown in FIG. 4 of the base plate 31. The rotational axle 75 is supported by the washer 65 but could also be supported by a ball bearing or the like. Therefore, when the cooling fan 1 is manufactured, it is possible to assemble the cooling fan 1 from the top side in FIG. 4. Because an assembly process step in which a conventional cooling fan is turned over, assembly of the cooling fan of the present invention is easy because such a step is unnecessary. Moreover, the number of parts is few and the structure is simple. Furthermore, noise does not occur from the supporting ball bearing or washer and, thus, noise is further reduced.

Seven fan blades 72 are provided at equal intervals along the side of the outer periphery of the rotor main body 71 and project radially outwardly therefrom. In this case, each fan blade 72 is curved at its aspiration side and set at a prescribed angle of inclination against the rotation axle 75. The fan blades 72 are identical in both shape and dimension.

Figure 7:
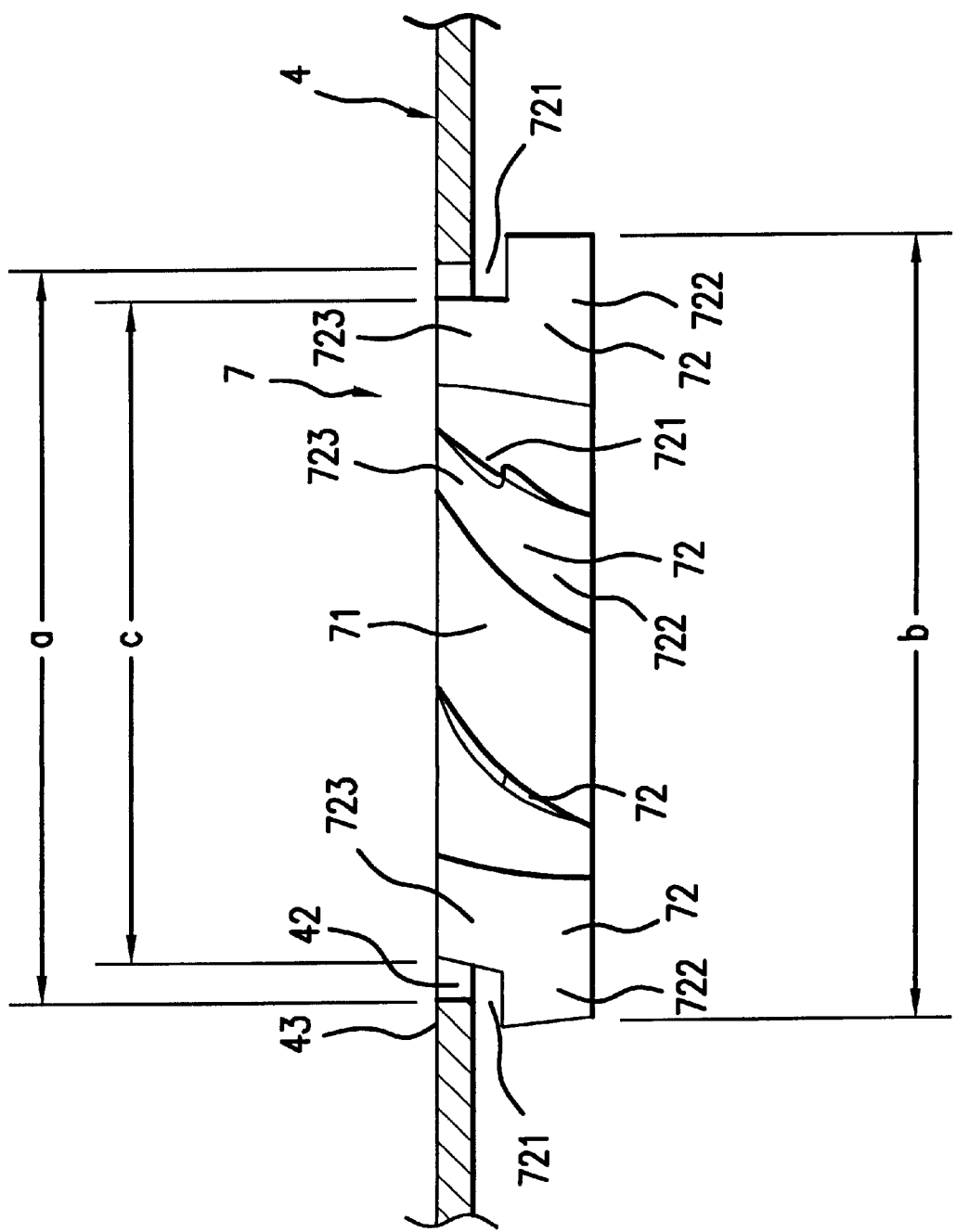
FIG. 7 is a side view showing the rotor of the fan motor of the cooling fan of the present invention shown in FIG. 1.

FIG. 7 is a side view showing the rotor 7 of the fan motor 5.

As shown in FIG. 7, each fan blade 72 includes the large diameter part 722 and a small diameter part 723 relatively positioned. That is, each fan blade 72, respectively, has a cutaway portion 721 to create a stepped portion disposed radially outwardly of each fan blade 72.

An outermost diameter "b" of the fan blades 72 and an innermost diameter "a" of the air aspiration aperture 42 are set so that the outermost diameter "b" of the fan blade 72 is larger than the innermost diameter "a" of the air aspiration aperture 42.

Furthermore, an outer diameter "c" of the small diameter parts 723 and the innermost diameter "a" of the air aspiration aperture 42 are set so that the outer diameter "c" of the small diameter part 723 is smaller than the innermost diameter "a" of the air aspiration aperture 42.

In this way, extraction of the rotor 7 from the air aspiration aperture 42 is prevented. This structure enables a larger air current to flow through the cooling fan 1 by virtue of the outermost diameter "b" of the fan blades 72 being larger than the innermost diameter "a" of the air aspiration aperture 42, that is, by providing the large diameter part 722. Further, it is possible to position the small diameter part 723 within the air aspiration aperture 42 by virtue of the outer diameter "c" of the small diameter part 723 smaller than the innermost diameter "a" of the air aspiration aperture 42. As a result, the cooling effect is improved because it is possible to improve the air current force through the cooling fan 1 without increasing the thickness "h" of the cooling fan 1.

The rotor 7 is arranged so that the center of rotation of the rotor 7 of the fan motor 5 is in a position so that it agrees with the center of the air aspiration aperture 42.

Also, when the distal end of the rotation axle 75 of the rotor 7 abuts the washer 65 of the stator 6, a top portion of the rotor 7 agrees with a top side surface of the lid 4 as shown in FIG. 7. Therefore, each small diameter part 723 is positioned within the air aspiration aperture 42 and the edge 43 of the air aspiration aperture 42 is positioned in a non-contacting relationship within each cutaway portion 721.

Further, by positioning the top side surface of the rotor 7 in agreement with the top side surface of the lid 4, the top side surface of the rotor 7 can be made thinner than the thickness "h" of the cooling fan 1, as well as being able to prevent the top side surface of the rotor 7 from contacting the top side surface of the lid 4 and other components when either handling the cooling fan 1 or driving the fan motor 5.

Moreover, when the distal end of the rotation axle 75 of the rotor 7 abuts the washer 65 of the stator 6, it is possible for the top side portion of the rotor 7 to be positioned in the bottom side of the top side surface of the lid 4. In this case as well as in the same way as described above, the top portion of the rotor 7 can be prevented from contacting other components as well as being able to render the thickness "h" of the cooling fan 1 narrower.

As shown in FIG. 4, an insulation sheet 9 is provided on the base plate 31 of the casing main body 3 and the circuit board 8 is provided above the insulation sheet 9. The circuit board 5 controls the driving of the fan motor 5.

As shown in FIG. 3, the circuit board 8 has a driver circuit element 83, a hole sensor (not shown) that senses the polarity of the cylindrical permanent magnet 74 of the rotor 7 of the fan motor 5. Also, a lead wire 11 for supplying electrical power is electrically connected to the circuit board 8. Further, the notch 82 is provided in the top side of the circuit board 8.

A center portion 81 of the circuit board 8 is positioned from the center of the base plate 31 of the casing main body 3. Therefore, the center portion 81 of the circuit board 8 is arranged in a position that is displaced with respect to the center of rotation of the fan motor 5. As a result, the number of components of the fan motor 5 is few and the circuit board 8 is small which, in turn, contributes to the thickness "h" of the cooling fan 1 to be thinner. Also, a terminal of the lead wire 11 is threaded between radiator plates 81. As a result, it is easy to pull the lead wire 11 to the exterior of the cashing main body 3. Moreover, the length of the lead wire 11 within the casing 2 becomes short. All of these factors contribute to an improved cooling effect.

There is no particular limitation in the dimensions of the cooling fan 1. However, it is possible, for example, to define the thickness "h" of the cooling fan 1 as being equal to or less than 9 mm and, in particular, being equal to or less than 7 mm.

Next, the operation of the cooling fan 1 is described. The fan motor 5 is driven by single-phase bipolar drive interchangeably switching the direction of current in conjunction with supplying current to the coil 63.

Specifically, an N pole is formed in each first claw part 623 and an S pole is formed in each second claw part 626 of the yoke 62 by sending an electric current to the coil 63 of the stator 6 of the fan motor 5. As a result, four terminals each are formed mutually to the N pole and the S pole, respectively. Then, when the direction of the electrical current is reversed, the polarity of the yoke 62 is reversed. That is, the S pole is formed to each first claw part 623, and the N pole is formed to each second claw part 626 of the yoke 62. Then, by repeating this, the polarity of each first claw part 623 and the polarity of each second claw part 626 are repeatedly reversed. Correspondingly, the rotor 7 rotates in a counter-clockwise manner, as shown by arrow "y" shown in FIGS. 1–3.

The polarity of the cylindrical permanent magnet 74 of the rotor 7 is detected by a hole sensor (not shown). Corresponding to the detection result, the direction of the electric current that is conducted to the coil 63 is switched.

By doing this, when the rotor 7 is rotated in the counter-clockwise direction as shown by arrow "y" in FIGS. 1–3, air is aspirated into the casing 2 from the air aspiration aperture 42. The air is expanded in a radial shape toward the base plate 31, and is expelled to the outer part of the casing 2 from the side part between each radiator plate 32, i.e., along each of air current paths 33 (FIG. 5).

On the other hand, because the outer side base surface 313 of the casing 2 contacts the object 200 to be cooled, heat generated from the object 200 to be cooled is aspirated from the base plate 31 and transfers to each radiator plate 32. Also, the object 200 to be cooled is cooled when the heat of the base plate 31 or each radiator plate 32 is dispersed to the exterior of the cooling fan 1 by the air current that flows from the side part of the air aspiration aperture 42, which has been described above.

At this point, when driving the fan motor 5, because the rotor 7 applies a force to the base plate 31 by the aspirated air current from the air aspiration aperture 42, the rotor 7 is stably rotated without the fan blades 72 contacting the lid 4.

Although the cooling fan and cooling fan assembly of the present invention has been described above based on the examples of the structure shown in the figures, the present invention is not limited thereby.

For example, the number, shape, dimensions, and the like, of the fan blades 72 is not limited to what is shown in the drawings. Below, another structural arrangement of the fan blades of the rotor 7 is described.

Figure 8:
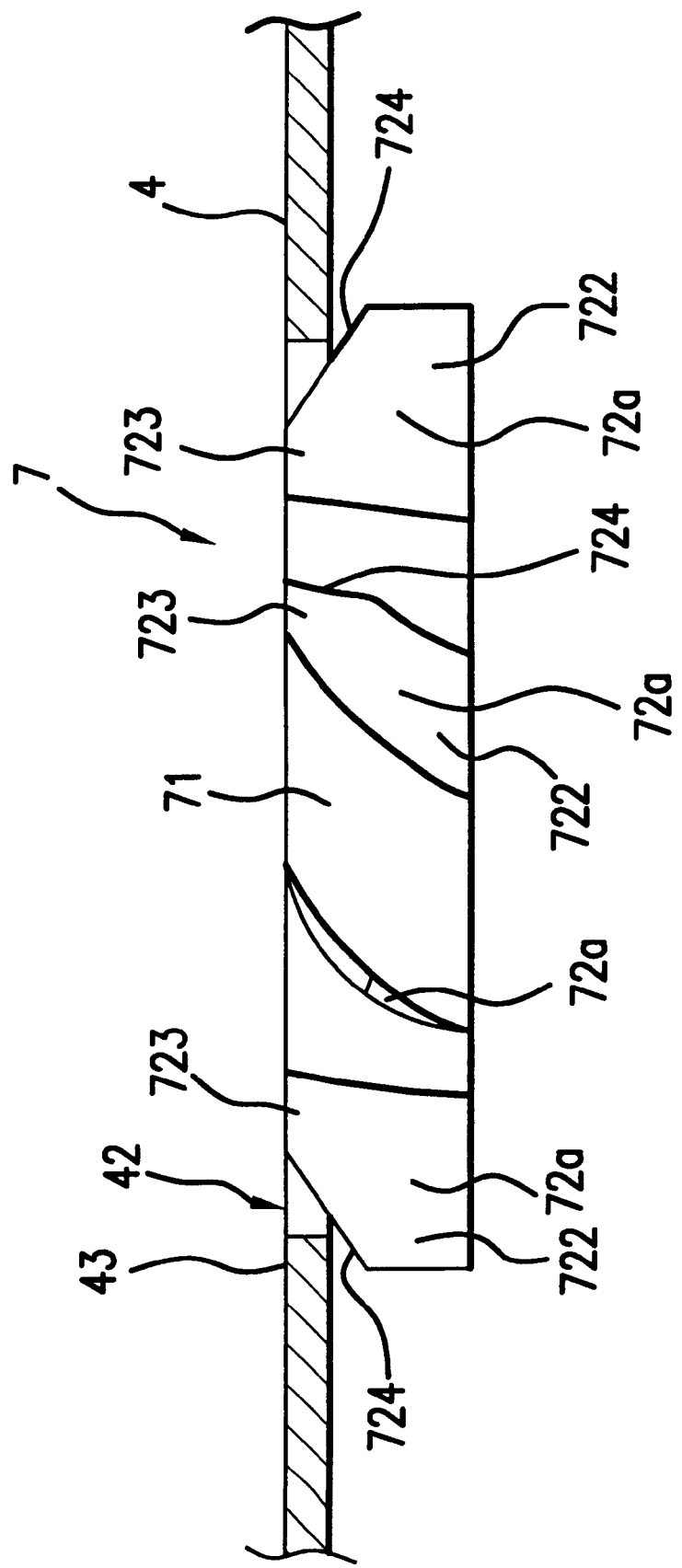
FIG. 8 is a side view showing a rotor has an alternative configuration.

FIG. 8 is a side view showing an example of an alternate structure of the rotor 7 in which the fan blades are configured in an alternate shape.

As shown in FIG. 8, each fan blade 72a has an inclined part 724. The description of the fan blades 72 is the same as the fan blades 72 that were described above in the case of the fan blades 72a (as the fan blades 72 that were previously described), it is possible to improve the force of the air current without increasing the thickness "h" of the cooling fan 1 as well as prevent the extraction of the rotor 7 from the air aspiration aperture 42. Thus, the cooling effect is improved.

A semiconductor element such as a CPU (central computing processing device), a microprocessor, a RISC processor, and the like, or an electronic mechanical circuit and the like which is used in semiconductor elements, are provided, for example, as the object 200 to be cooled 200. Moreover, it is possible for the cooling fan 1, in particular, to be used for cooling of the CPU in a notebook-type personal computer. In addition, it is possible to apply the cooling fan 1 in a portable information terminal in which the electronic mechanical circuits are installed.

What is claimed is:

1. A cooling fan for cooling an object, comprising:

a casing including a casing main body including a radiator and a lid formed with an aperture, said casing main body including a base member; and a fan motor disposed within said casing, said fan motor including a rotational member having a plurality of fan blades that project radially outwardly and a fixed member connected to said casing main body, whereby an air current flows through said aperture and said radiator when said fan motor is actuated in order to cool the object, wherein an outer fan diameter of said fan blades is larger than an inner aperture diameter of said aperture, and said fan blades are rotatable without contacting said lid, and wherein said rotational member is magnetically attracted to said base member at least when rotation of said fan blades has stopped.

2. The cooling fan of claim 1, wherein each of said fan blades includes a large diameter part having a large outer diameter and a small diameter part having a small outer diameter, the large outer diameter of said large diameter part being larger than the inner aperture diameter of said aperture, the small outer diameter of said small diameter part being smaller than the inner aperture diameter of said aperture.

3. The cooling fan of claim 2, wherein at least a portion of said small diameter part is within said aperture.

4. The cooling fan of claim 1, wherein each of said fan blades has a cutaway portion, and said lid has an edge defining said aperture, said edge being positioned within said cutaway portion.

5. The cooling fan of claim 1, wherein said fan motor drives the rotational member so as to aspirate air from said aperture and expel air from said radiator.

6. The cooling fan of claim 1, wherein said casing main body includes an outer side base surface for contacting the object, said outer side base surface being flat and free of holes.

7. The cooling fan of claim 1, wherein said radiator has a plurality of radiator plates arranged in an axial direction away from said rotational member, wherein consecutive ones of the radiator plates form an air current path therebetween with a cross sectional area gradually increasing toward an air expulsion direction.

8. The cooling fan of claim 1, further comprising a circuit board connected to the base member within said casing main body and controlling actuation of said fan motor wherein, a center portion of said circuit board is displaced within said casing main body relative to a rotational center of said fan motor.

9. The cooling fan of claim 1, further comprising a circuit board disposed on a base member within said casing main body for controlling actuation of said fan motor, wherein said radiator has a plurality of radiator plates positioned in the axial direction away from said rotational member, at least one radiator plate cooperating with said circuit board to determine a position of said circuit board within said casing main body.

10. The cooling fan of claim 1, wherein a rotational top surface of said rotational member and a lid top surface of said lid are disposed in a common plane, or is positioned in the vicinity of a bottom side said lid.

11. The cooling fan of claim 1, wherein said rotational member has a rotation axle having a distal end contacting a base member of said casing main body at a point.

12. The cooling fan of claim 1, wherein said fixed member includes a coil and a pair of yokes with each yoke having a plurality of claws, said yoke sized to encase the coil in a manner that respective ones of the plurality of claws from each yoke are alternately disposed about a coil periphery of said coil without consecutive ones of the claws contacting each other.

13. A cooling fan assembly, the object to be cooled is connected to said cooling fan of claim 1.

14. A cooling fan for cooling an object, comprising:

a casing including a casing main body including a radiator and a lid formed with an aperture;

a fan motor disposed within said casing, said fan motor including a rotational member having a plurality of fan blades that project radially outwardly and a fixed member connected to said casing main body, whereby an air current flows through said aperture and said radiator when said fan motor is actuated in order to cool the object; and a circuit board disposed on a base member within said casing main body for controlling actuation of said fan motor, wherein said radiator has a plurality of radiator plates positioned in an axial direction away from said rotational member, at least one radiator plate cooperating with said circuit board to determine a position of said circuit board within said casing main body, wherein an outer fan diameter of said fan blades is larger than an inner aperture diameter of said aperture, and said fan blades are rotatable without contacting said lid.

15. A cooling fan for cooling an object, comprising:

a casing including a casing main body including a radiator and a lid formed with an aperture; and a fan motor disposed within said casing, said fan motor including a rotational member having a plurality of fan blades that project radially outwardly and a fixed member connected to said casing main body, whereby an air current flows through said aperture and said radiator when said fan motor is actuated in order to cool the object;

wherein each of said plurality of fan blades has a large width portion and a small width portion, the large width portion of each of said plurality of fan blades being adjacent to said rotational member and transitioning discontinuously into the small width portion, and a radially distal end of the small width portion of each of said plurality of fan blades cooperating to form an outer fan diameter, and wherein the outer fan diameter is larger than a diameter of said aperture, and said fan blades are rotatable without contacting said lid.

* * * * *